(12) United States Patent  
Liao et al.

(10) Patent No.: US 7,528,545 B2  
(45) Date of Patent: May 5, 2009

(54) COLOR ORGANIC OLED DEVICE (75) Inventors: Liang-Sheng Liao, Rochester, NY (US); Kevin P. Klubek, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 40 days.

(21) Appl. No.: 11/401,069

(22) Filed: Apr. 10, 2006

(65) Prior Publication Data  
US 2006/0181202 A1  Aug. 17, 2006

Related U.S. Application Data (63) Continuation of application No. 10/772,867, filed on Feb. 6, 2004, now Pat. No. 7,030,554.

(51) Int. Cl.  
H01L 51/00 (2006.01)  
H05B 33/00 (2006.01)  
H01J 1/62 (2006.01)  
H05B 33/12 (2006.01)

(52) U.S. Cl. ............... 313/506; 313/504; 313/505; 428/690

(58) Field of Classification Search .......... 313/504, 313/506, 507–512  
See application file for complete search history.

(56) References Cited

U.S. PATENT DOCUMENTS

| 4,769,292 | A | 9/1988 | Tang et al. |
| 5,937,272 | A | 8/1999 | Tang |
| 6,107,734 | A | 8/2000 | Tanaka et al. |
| 6,366,025 | B1 | 4/2002 | Yamada |
| 6,548,956 | B2 * | 4/2003 | Forrest et al. ............. 313/504 |
| 6,552,706 | B1 | 4/2003 | Ikeda et al. |
| 7,169,482 | B2 * | 1/2007 | Aziz et al. ............... 428/690 |
| 2002/0015110 | A1 | 2/2002 | Brown Elliott |
| 2002/0180347 | A1 * | 12/2002 | Adachi et al. ............. 313/503 |
| 2003/0077480 | A1 | 4/2003 | Hosokawa et al. |
| 2003/0170491 | A1 * | 9/2003 | Liao et al. ............... 428/690 |
| 2003/0230972 | A1 * | 12/2003 | Cok ......................... 313/504 |
| 2005/0248267 | A1 * | 11/2005 | Gyoutoku et al. ......... 313/506 |

FOREIGN PATENT DOCUMENTS

EP  1 351 558  10/2003

* cited by examiner

Primary Examiner—Sikha Roy  
Assistant Examiner—Tracie Y Green  
(74) Attorney, Agent, or Firm—Raymond L. Owens (57) ABSTRACT

An OLED device comprising an anode and a cathode spaced from the anode, two EL units disposed between the anode and cathode, such EL units being in contact with each other and each having at least one light emitting layer; and each EL unit further includes a p-type doped organic hole transporting layer disposed between the light emitting layer and the anode, and an n-type doped organic electron transporting layer disposed between the light emitting layer and the cathode.

8 Claims, 5 Drawing Sheets

COLOR ORGANIC OLED DEVICE

CROSS-REFERENCE TO RELATED APPLICATIONS

This is a continuation of application Ser. No. 10/772,867, filed Feb. 6, 2004 now U.S. Pat. No. 7,030,554 by Liang-Sheng Liao et al., entitled "A Full-Color Organic Display Having Improved Blue Emission".

FIELD OF INVENTION

The present invention relates to a color organic OLED device.

BACKGROUND OF THE INVENTION

There is an array of pixels in a full-color organic display (also known as an organic light-emitting display). Each pixel can include red, green, and blue electroluminescence (EL) subpixels (commonly referred to as light-emitting subpixels, RGB subpixels, or RGB elements). Each light-emitting subpixel consists of a basic organic light-emitting diode (OLED). The basic OLED has in common an anode, a cathode, and an organic EL medium (or EL unit) sandwiched between the anode and the cathode. The organic EL medium can include one or more layers of organic thin films, where one of the layers is primarily responsible for EL or light emission. This particular layer is generally referred to as the light-emitting layer (LEL) of the organic EL medium. Other organic layers present in the organic EL medium can primarily provide charge transport functions and are referred to as either the hole-transporting layer (HTL) or the electron-transporting layer (ETL). Tang et al. demonstrated highly efficient OLEDs in "Organic Electroluminescent Diodes", *Applied Physics Letters*, 51, 913 (1987) and in commonly assigned U.S. Pat. No. 4,769,292. Since then, numerous OLEDs with alternative layer structures have been disclosed, and many different types of EL materials have also been synthesized for use in OLEDs. In forming the pixels in a full-color organic display, it is also necessary to apply a method to precisely pattern the LEL of the organic EL medium or the entire organic EL medium. In commonly assigned U.S. Pat. No. 5,937,272, Tang has taught a method of patterning multicolor EL subpixels onto a thin-film-transistor (TFT) array substrate by vapor deposition of the EL materials. Therefore, combining the basic OLED structure with organic EL materials, a precision patterning method, and a driving circuitry, a full-color organic display can be realized.

Lifetime of a full-color organic display is very important for display applications. The lifetime of a full-color organic display is mainly determined by the lifetime of the EL subpixels. Specifically, the lifetime of a full-color organic display is generally determined by the EL subpixel color that has the shortest lifetime within each of the pixels. The lifetime of an EL subpixel is defined as the time to reach half the initial luminance at a given current density. The lifetime of a blue EL subpixel is shorter than that of a green EL subpixel and even much shorter than that of a red EL subpixel. Obviously, the lifetime of a full-color organic display is limited by the blue EL subpixel. Therefore, improving the lifetime of the blue EL subpixels will have a large impact on display applications.

There are several ways to improve the lifetime of the blue OLEDs. For example, Shi et al. in "Anthracene Derivatives for Stable Blue-Emitting Organic Electroluminescence Devices", *Applied Physics Letters*, 80, 3201 (2002) and Hosokawa et al. in U.S. Patent Application Ser. No. 2003/0077480 A1, achieved improved operational stability of blue emission by selecting proper materials. On the other hand, Yamada in U.S. Pat. No. 6,366,025 B1 and Cok et al. in commonly-assigned U.S. patent application Ser. No. 10/315,622, entitled "Color OLED Display Having Repeated Patterns of Colored Light Emitting Elements" disclosed a full-color organic display having EL subpixels with different surface emitting areas, wherein the surface emitting areas of the EL subpixels are selected to extend the lifetime as well as to achieve better white balance through combined red, green, and blue emission.

From the operational point of view, the lifetime of an EL subpixel is dependent on the drive current density. A blue EL subpixel with a relatively large surface emitting area will need less current density to achieve the same brightness as a blue EL subpixel with a smaller surface emitting area. Therefore, the lifetime can be expected to increase. However, in a full-color display, the total surface emitting area of each pixel is predetermined. If a blue EL subpixel within a pixel occupies a relatively large surface emitting area, the red and green EL subpixels would then have to occupy relatively small surface emitting areas. This means the red and green EL subpixels have to be driven at a relatively high current density to reach a certain brightness. As a result, emitting at the same brightness, the red and green EL subpixels with smaller surface emitting areas will have shorter lifetimes than those red and green EL subpixels with larger surface emitting areas. Therefore, the lifetime improvement of the blue EL subpixel is at the expense of the lifetime of the red and green EL subpixels.

SUMMARY OF THE INVENTION

It is an object of the present invention to improve the performance and lifetime of a color organic OLED device.

This object is achieved by an OLED device comprising:
  a) an anode and a cathode spaced from the anode;
  b) two EL units disposed between the anode and cathode, such EL units being in contact with each other and each having at least one light emitting layer; and
  c) each EL unit further includes a p-type doped organic hole transporting layer disposed between the light emitting layer and the anode, and an n-type doped organic electron transporting layer disposed between the light emitting layer and the cathode.

Since the dimensions of EL subpixels such as layer thicknesses in a full-color organic display are frequently in submicrometer ranges, the drawings of FIGS. 1 to 6 are scaled for ease of visualization rather than dimensional accuracy.

DETAILED DESCRIPTION OF THE INVENTION

The present invention will be described using a bottom-emitting configuration, which means light emits through a transparent bottom electrode and a transparent substrate. However, the present invention is not limited to this configuration. It is also applicable to the top-emitting configuration, which means light emits through a transparent or half-transparent top electrode. The present invention is also applicable to other configurations where a plurality of EL units is used in a blue EL subpixel, such as passive matrix displays comprised of orthogonal arrays of anodes and cathodes to form pixels.

In order to more fully appreciate the construction of the full-color organic display having more than one EL unit in a blue EL subpixel in each of the pixels in accordance with the present invention, a pixel structure and an EL subpixel structure of a prior art full-color organic display will be described with reference to FIG. 1 and FIG. 2, respectively.

Figure 1:
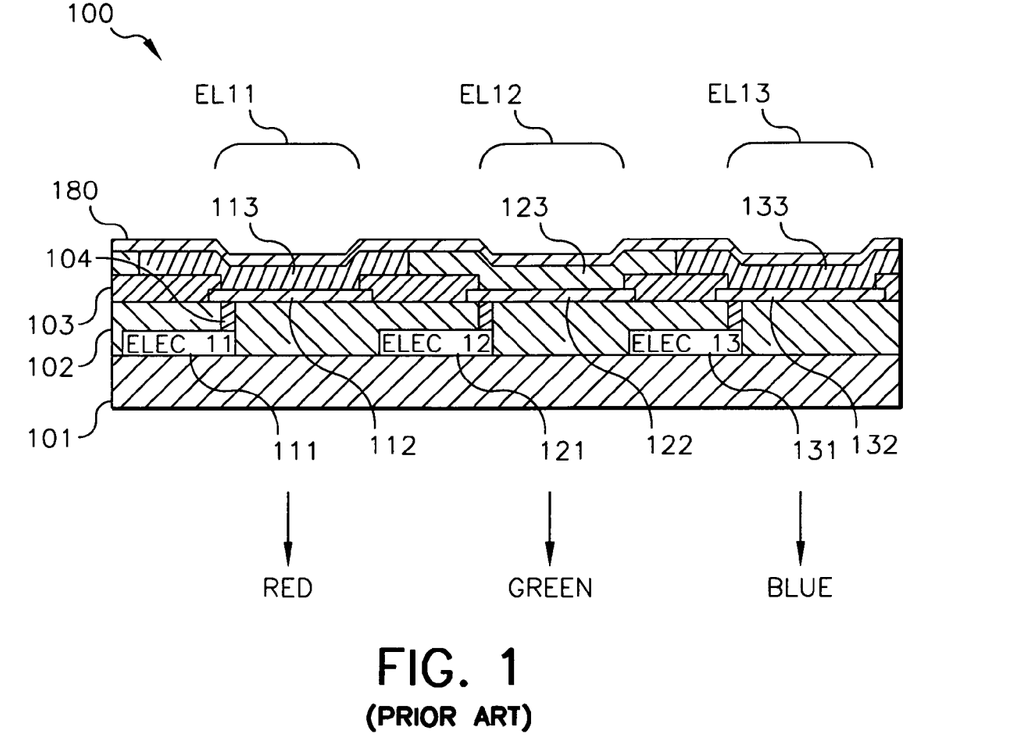
FIG. 1 shows a cross-sectional view of a pixel structure in a prior art full-color organic display.

In FIG. 1, there are three different colored EL subpixels in pixel 100, wherein EL11, EL12, and EL13 are red, green, and blue EL subpixels, respectively. Provided over transparent substrate 101, are transparent organic insulating layers 102 and 103, and the circuitry unit (the wiring, capacitors, and transistors) necessary to drive the individual EL subpixels in the array. For clarity, the circuitry unit in each subpixel is designated by blocks ELEC11 (part 111), ELEC12 (part 121), and ELEC13 (part 131), used to drive EL11, EL12, and EL13, respectively. Provided over organic insulating layer 102 is an array of optically transparent anode pads, 112, 122, and 132, that are connected to ELEC11, ELEC12, and ELEC13 by conductive wiring 104, respectively. Organic insulating layer 103 is provided over organic insulating layer 102 and anode pads 112, 122, and 132, and patterned to reveal the anode pads. Provided over the anode pads (112, 122, and 132) and organic insulating layer 103 are organic EL units, 113, 123, and 133, that correspond to red, green, and blue emission in EL11, EL12, and EL13, respectively. Provided over the EL units is the cathode 180. The EL unit in each of the subpixels includes at least an HTL, a LEL, and an ETL. When EL11, EL12, and EL13 are driven by an active matrix circuitry, red, green, and blue light is emitted, respectively. The emitted light passes through the transparent anode, transparent organic insulating layer, and the transparent substrate. The surface emitting area of each EL subpixel in a pixel is defined by the contact area with its individual anode. The surface emitting area of each EL subpixel can be the same or can be different.

Figure 2:
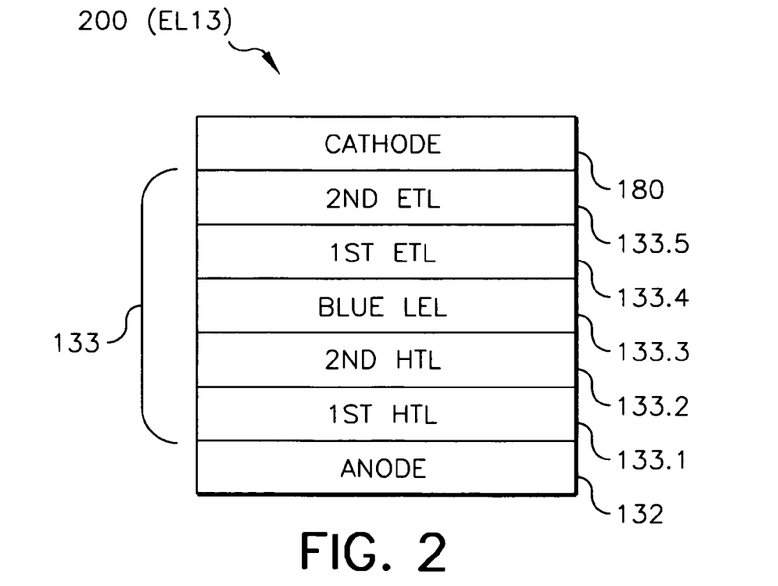
FIG. 2 shows a cross-sectional view of a blue EL subpixel in a pixel of a prior art full-color organic display showing in FIG. 1.

Shown in FIG. 2 is a detailed layer structure of a blue EL subpixel EL13 (or subpixel 200) in pixel 100. EL subpixel 200 contains a blue EL unit 133 disposed between anode pad 132 and cathode 180. The blue EL unit 133 has a $1^{st}$ HTL 133.1, a $2^{nd}$ HTL 133.2, a blue LEL 133.3, a $1^{st}$ ETL 133.4, and $2^{nd}$ ETL 133.5. In some cases, the $1^{st}$ HTL 133.1 can also be referred to as a hole-injecting layer (HIL) and the $2^{nd}$ ETL 133.5 can also be referred to as an electron-injecting layer (EIL). In some other cases, the $1^{st}$ HTL 133.1 and/or the $2^{nd}$ ETL 133.5 can be omitted. Subpixel 200 can represent the red EL subpixel EL11 in pixel 100 when the blue LEL 133.3 is replaced by a red LEL. Subpixel 200 can also represent the green EL subpixel EL12 in pixel 100 when the blue LEL 133.3 is replaced by a green LEL.

Figure 3:
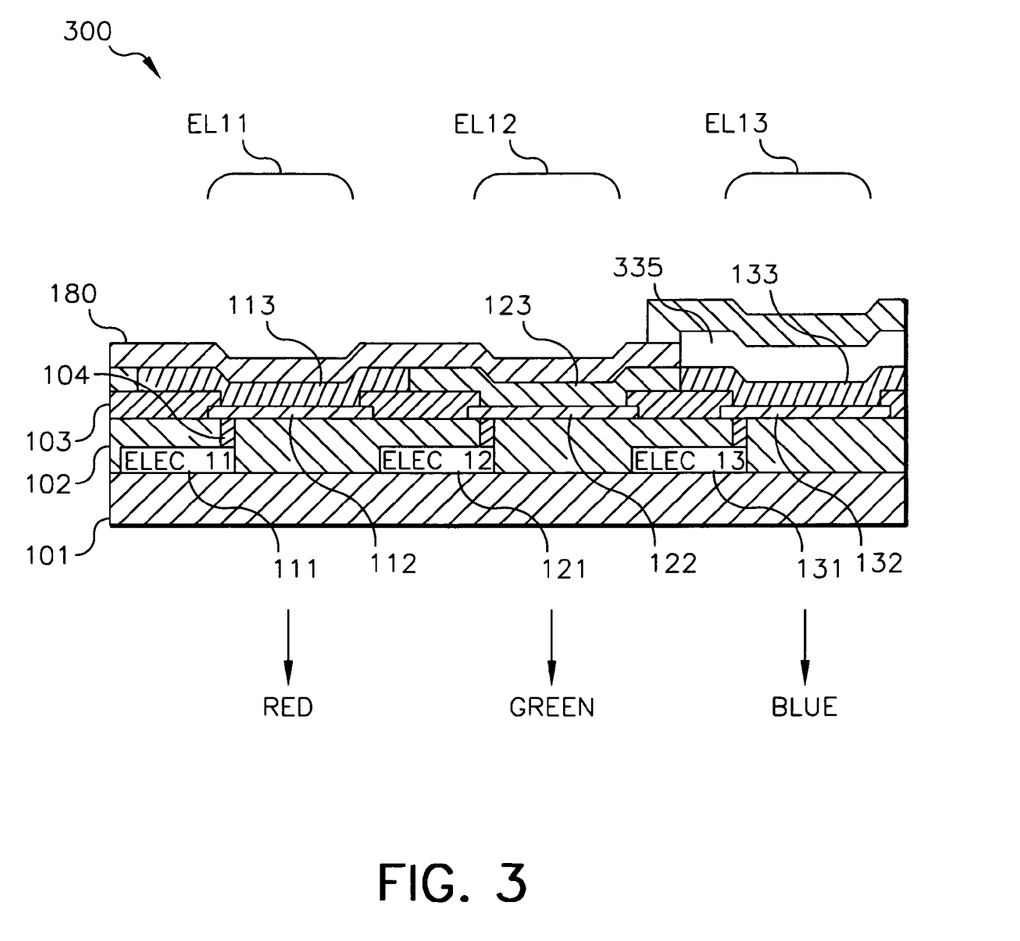
FIG. 3 shows a cross-sectional view of a pixel structure of one embodiment of the full-color organic display in accordance with the present invention.

FIG. 3 illustrates a non-limiting, useful embodiment of a pixel structure in a full-color organic display in accordance with the present invention, as pixel 300. Pixel 300 is similar to pixel 100 except that in the blue EL subpixel EL33, sandwiched between anode pad 132 and cathode 180 are two EL units (units 133 and 335). EL unit 133 is disposed over the anode pad 132 and organic insulating layer 103. EL unit 335 is disposed over EL unit 133 and it is covered by cathode 180. When EL11, EL12, and EL23 are driven by an active matrix circuitry, red, green, and blue light is emitted, respectively. Compared to ELI 3 in pixel 100 (FIG. 1), EL33 in pixel 300 has double the luminous efficiency at the same current density. Therefore, half the current density is needed to keep a predetermined brightness. Since lifetime is in reverse proportion to the drive current density, the lifetime of EL33 can be increased by a factor of 2. As a result, the overall lifetime of the full-color organic display can also be increased. The EL33 shown in FIG. 3 is a preferred structure having two EL units, but in order to further increase the lifetime, the blue EL subpixel EL33 in pixel 300 can have more than 2 EL units. The number of EL units can be in a range of from 2 to 5.

Figure 4:
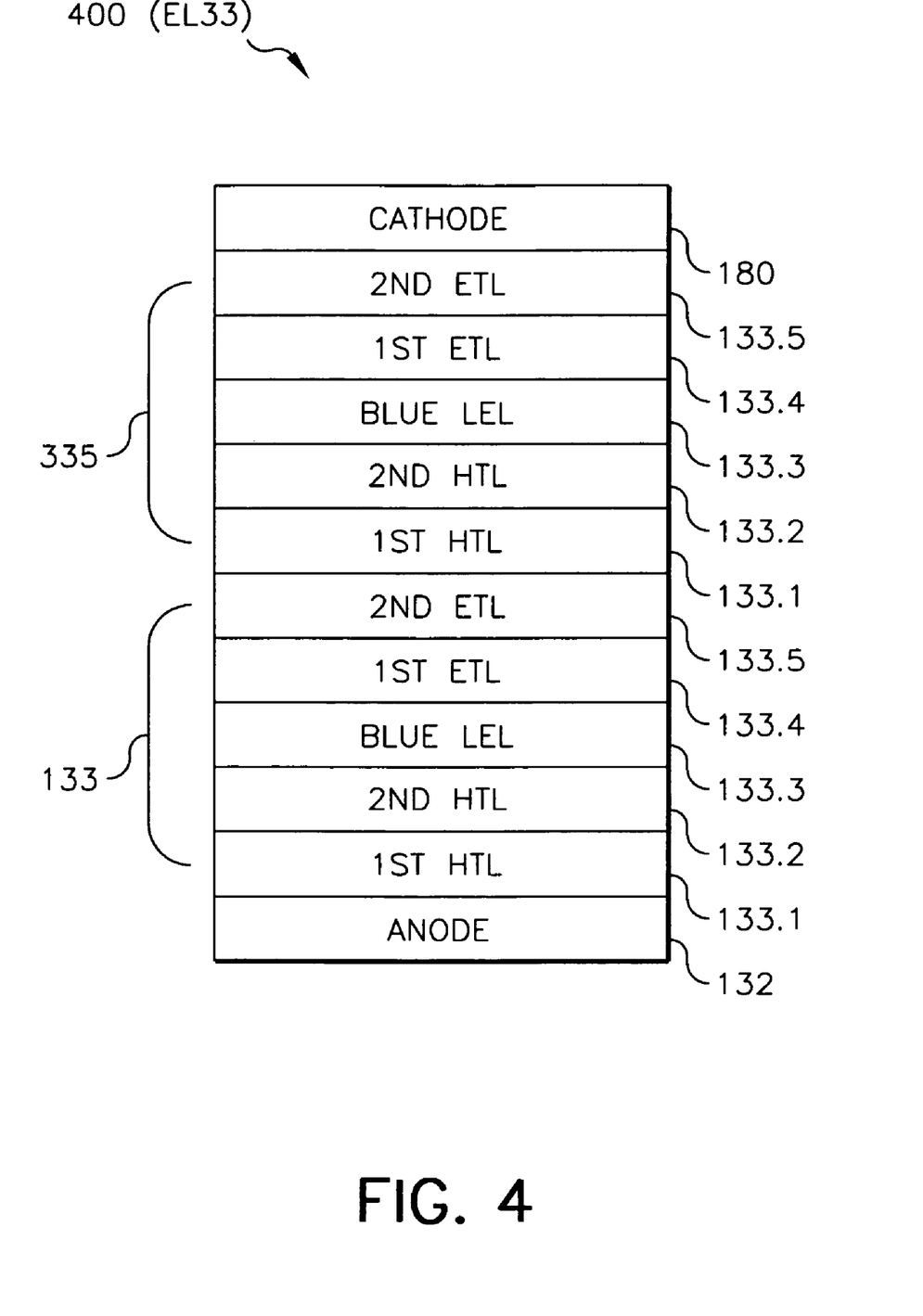
FIG. 4 shows a cross-sectional view of a blue EL subpixel in a pixel in accordance with the embodiment of the present invention shown in FIG. 3.

Shown in FIG. 4 is the detailed layer structure of EL33 (subpixel 400) in pixel 300. A first EL unit 133, containing the following, a $1^{st}$ HTL 133.1, a $2^{nd}$ HTL 133.2, a blue LEL 133.3, a $1^{st}$ ETL 133.4, and $2^{nd}$ ETL 133.5, is disposed over the anode pad 132. A second EL unit 335, also containing the following, a $1^{st}$ HTL 133.1, a $2^{nd}$ HTL 133.2, a blue LEL 133.3, a $1^{st}$ ETL 133.4, and $2^{nd}$ ETL 133.5, is disposed over the first EL unit 133 with its $1^{st}$ HTL 133.1 in contact with the $2^{nd}$ ETL 133.5 of the first EL unit 133. Cathode 180 is disposed over the second EL unit 335. This vertically stacked structure is called a stacked OLED or cascaded OLED. Liao et al. in commonly-assigned U.S. Patent Application 20030170491A1 and commonly-assigned U.S. patent application Ser. No. 10/437,195, entitled "Cascaded Electroluminescent Device Having Connecting Units With N-Type and P-Type Organic Layers", have disclosed the methods to fabricate this structure. The disclosures of the cited patents and patent applications are incorporated herein by reference.

Figure 5:
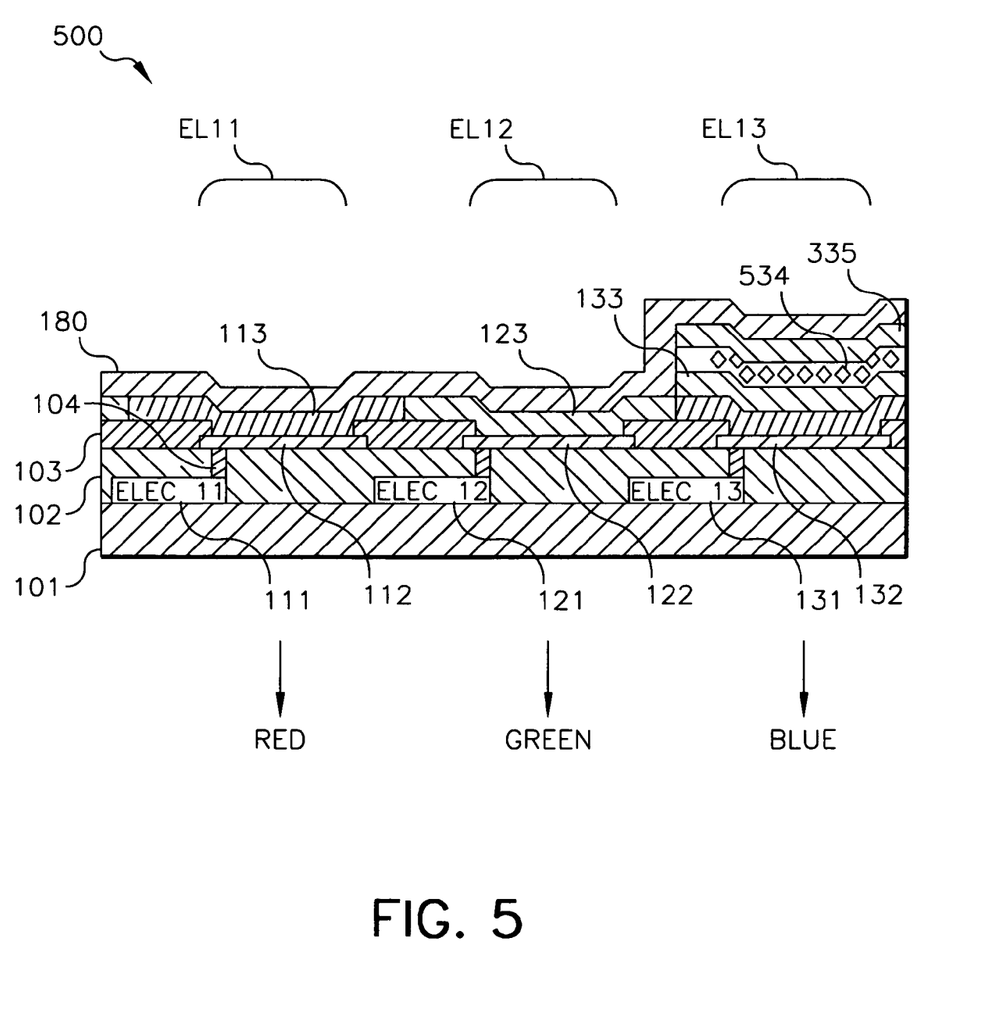
FIG. 5 shows a cross-sectional view of a pixel structure of another embodiment of the full-color organic display in accordance with the present invention.

FIG. 5 illustrates another non-limiting, useful embodiment of a pixel structure in a full-color organic display in accordance with the present invention, as pixel 500. Pixel 500 is the same as pixel 300 except that in the blue EL subpixel EL53, an intermediate connector 534 is sandwiched between EL unit 133 and EL unit 335. When EL11, EL12, and EL53 in pixel 500 are driven by an active matrix circuitry, red, green, and blue light is emitted, respectively. Compared to EL13 in pixel 100 (FIG. 1), EL53 has double the luminous efficiency at the same current density. Therefore, half the current density is needed to keep a predetermined brightness, and the lifetime of EL53 can be increased by a factor of 2. As a result, the overall lifetime of the full-color organic display can also be increased. The EL53 shown in FIG. 5 is a preferred structure having two EL units, but in order to further increase the lifetime, the blue EL subpixel EL53 in pixel 500 can have more than 2 EL units. The number of EL units can be in a range of from 2 to 5. Accordingly, the number of the intermediate connectors can be in a range of from 1 to 4. If the number of the intermediate connectors is 0, it is then the case as in FIG. 3.

Figure 6:
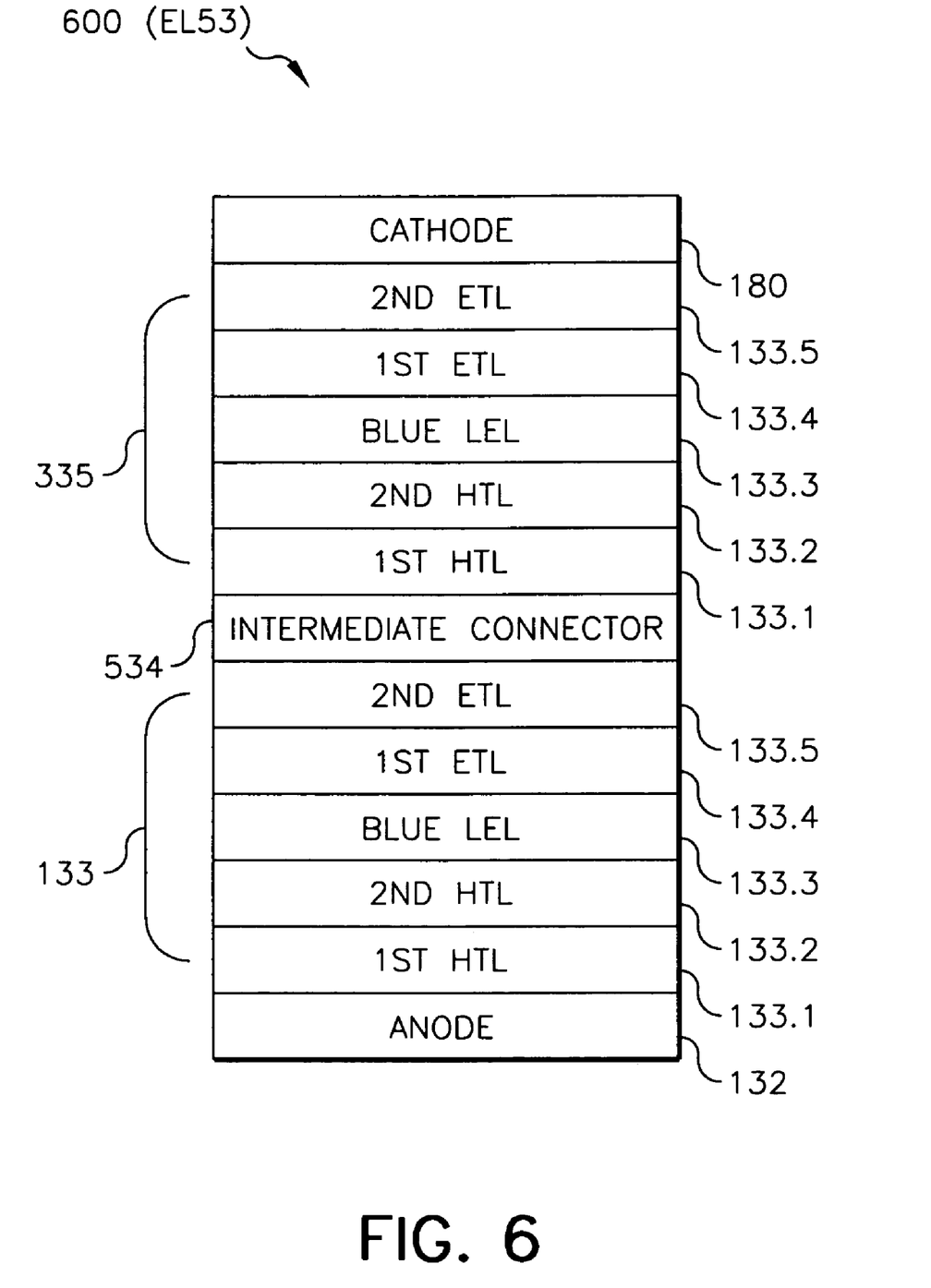
FIG. 6 shows a cross-sectional view of another blue EL subpixel in a pixel in accordance with the embodiment of the present invention shown in FIG. 5.

Shown in FIG.6 is the detailed layer structure of EL53 (subpixel 600) in pixel 500. EL53 is the same as EL33 except that an intermediate connector 534 is sandwiched between the $2^{nd}$ ETL of EL unit 133 and the $1^{st}$ HTL of EL unit 335. This is another type of vertically stacked structures. Tanaka et al. in U.S. Pat. No. 6,107,734, Jones et al. in U.S. Pat. No. 6,337,492, Kido et al. in Japanese Patent Application JP200304676A, and Liao et al. in Docket 84916 have disclosed the methods to fabricate this structure. The disclosures of the cited patents and patent applications are incorporated herein by reference.

Detailed Device Features

Substrate

The EL subpixels of the present invention are typically provided over a supporting substrate where either the cathode or anode can be in contact with the substrate. The electrode in contact with the substrate is referred to as the bottom electrode. Conventionally, the bottom electrode is, but not be limited to, the anode. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

Anode

When EL emission is viewed through anode pads 112, 122, and 132, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the top cathode electrode, the transmissive characteristics of the anode are immaterial and any conductive material can be used, regardless if it is transparent, opaque or reflective. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

EL unit

The EL unit in the present invention can be, but is not limited to, a conventional organic medium structure having a $1^{st}$ HTL, a $2^{nd}$ HTL, a LEL, a $1^{st}$ ETL, and $2^{nd}$ ETL.

The HTLs in each of the red, green, and blue EL subpixels in pixel 300 and pixel 500 of the present invention contains at least one hole-transporting compound such as an aromatic tertiary amine. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTLs can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coroner)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) (also called PEDOT/PSS).

There may be differences between the $1^{st}$ HTL and the $2^{nd}$ HTL. One such difference is that the $1^{st}$ HTL includes at least one hole-transporting material as a host material and at least one electron-accepting material as a dopant material. This type of HTL is called a p-type doped organic layer. A p-type doped organic layer means that the layer is electrically conductive, and the charge carriers are primarily holes. The conductivity is provided by the formation of charge-transfer complex as a result of electron-transfer from the host material to the dopant. Depending on the concentration and the effectiveness of the dopant in accepting an electron from the host material, the layer electrical conductivity can range from semiconducting to conducting. The materials used as the p-type dopants in the p-type doped organic layer include organic compounds such as 2,3,5,6-tetrafluoro-7,7,8,8-tetracyanoquinodimethane ($F_4$-TCNQ) or other derivatives of TCNQ, or inorganic compounds such as iodine, $FeCl_3$, $FeF_3$, $SbCl_5$, or some other metal halides. In the case of polymeric hosts, the dopant can be any of the above or also a material molecularly dispersed or copolymerized with the host as a minor component. The $1^{st}$ HTL may be referred as an HIL, and may also be replaced by a metal compound layer having a p-type semiconducting property.

As more fully described in U.S. Pat. Nos. 4,769,292 and 5,935,721, the LEL in each of the red, green, and blue EL subpixels in pixel 300 and pixel 500 of the present invention includes a luminescent or fluorescent material where EL is produced as a result of electron-hole pair recombination in this region. The LEL can include a single material, but more commonly consists of a host material doped with a guest compound or compounds where light emission comes primarily from the dopant and can be of red color in the LEL of 113, green color in the LEL of 123, and blue color in the LELs of 133 and 335. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for selecting a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)].

Other classes of useful host materials include, but are not limited to, derivatives of anthracene, such as 2-(1,1-dimethylethyl)-9,10-bis(2-naphthalenyl) anthracene (TBADN), 9,10-di-(2-naphthyl)anthracene (ADN), and derivatives thereof as described in U.S. Pat. No. 5,935,721, distyrylarylene derivatives as described in U.S. Pat. No. 5,121,029, benzazole derivatives, for example, 2,2',2"-(1,3,5-phenylene)tris[1-phenyl-1H-benzimidazole], and blue emitting metal chelated oxinoid compounds, for example, Bis(2-methyl-8-quinolinolato) (4-phenylphenolato)aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming the ETLs in each of the red, green, and blue EL subpixels in pixel 300 and pixel 500 of the present invention are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

There may be differences between the $1^{st}$ ETL 133.4 and the $2^{nd}$ ETL 133.5. One such difference is that the $2^{nd}$ ETL is comprised of at least one electron-transporting material as a host material and at least one electron-donating material as a dopant material. This type of ETL is called an n-type doped organic layer. An n-type doped organic layer means that the layer is electrically conductive, and the charge carriers are primarily electrons. The conductivity is provided by the formation of charge-transfer complex as a result of electron-transfer from the dopant to the host material. Depending on the concentration and the effectiveness of the dopant in donating an electron to the host material, the layer electrical conductivity can range from semiconducting to conducting. The materials used as the n-type dopants in the n-type doped organic layer include metals or metal compounds having a work-function less than 4.0 eV. Particularly useful dopants include alkali metals, alkali metal compounds, alkaline earth metals, and alkaline earth metal compounds. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their inorganic or organic compounds, are particularly useful. The materials used as the n-type dopants in the n-type doped organic layer also include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. The $2^{nd}$ ETL may be referred as an EIL, and may also be replaced by a metal compound layer having an n-type semiconducting property.

Intermediate Connector

The optional intermediate connector 534 provided between blue EL units 133 and 335 is used to provide improved electron and hole injection into the adjacent blue EL units. To achieve good EL performance of this vertically stacked structure, this intermediate connector should not result in an increase in electrical resistance nor a decrease in the optical transparency, otherwise the driving voltage would increase and the light output would decrease. The chemical composition and the thickness of the intermediate connector will influence both the diffusion behavior and optical properties and will therefore need to be optimized. Since the organic layers are particularly sensitive to degradation during deposition, the method of deposition will need to be optimized as well.

The intermediate connector 534 includes at least one inorganic semiconducting material or combinations of more than one of the semiconducting materials. Suitable semiconducting materials should have an optical energy band gap less than 4.0 eV. The optical energy band gap is defined as the onset energy of the optical absorption peak. The optical energy band gap can be measured using a UV-Vis absorption spectrometer (such as an HP 8453 UV-Vis Spectrometer). A useful class of materials can be chosen from the compounds of subpixels listed in groups IVA, VA, VIA, VIIA, VIIIA, IB, IIB, IIIB, IVB, and VB in the Periodic Table of the Elements (e.g. the Periodic Table of the Elements published by VWR Scientific Products). These compounds include the carbides, silicides, nitrides, phosphides, arsenides, oxides, sulfides, selenides, tellurides, or mixture thereof. These semiconducting compounds can be in either stoichoimetic or non-stoichiometic states, that is they may contain excess or deficit metal component. Particularly useful materials for the intermediate connector 534 are the semiconducting oxides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, antimony, or combinations thereof. Particularly useful materials for the intermediate connector 534 also including zinc selenide, gallium nitride, silicon carbide, or combinations thereof. Preferably useful materials for the intermediate connector 534 include $WO_3$, $MoO_3$, $In_2O_3$, $SnO_2$, PbO, $Sb_2O_3$, SnSe, SnS, ZnSe, ZnS, $VO_2$, or $V_2O_5$.

The intermediate connector 534 also can include at least one or more metallic materials, at least one of these metallic materials has a work-function higher than 4.0 eV as listed by Sze, in *Physics of Semiconducting Devices*, $2^{nd}$ Edition, Wiley, N.Y., 1981, p. 251. Preferably useful materials for the intermediate connector 534 include Al, Ag, Au, Pd, or Pt.

Cathode

When light emission is viewed solely through the anode, the cathode 180 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material includes an MgAg alloy wherein the percentage of silver is in the range of 1 to 20%, as described in U.S. Pat. No. 4,885,221. Another suitable class of cathode materials includes bilayers includes a thin inorganic EIL in contact with an organic layer (e.g., ETL), which is capped with a thicker layer of a conductive metal. If the inorganic EIL includes a low work-function metal or metal salt, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron-beam evaporation, ion sputtering, or chemical vapor deposition.

Features of Display

A full-color organic display in accordance with the present invention can comprise more than one EL subpixel for some specific color in each pixel. The number of EL subpixels of each color in each pixel is determined according to the relative human visual frequency response to the color and the patterning complexity. As the human eyes are most sensitive to green light, Elliot in U.S. Patent Application 2002/0015110 and commonly-assigned U.S. patent application Ser. No. 10/315,622, proposed to arrange green EL subpixels diagonally in adjacent pixels or within a pixel in order to visually increase the special resolution. Therefore, the number of the green EL subpixels in a pixel in the present invention can be more than up to 4, and they are diagonally arranged within a pixel. As a result, a full-color organic display in accordance with present invention can have one red light-emitting subpixel, a plurality of green light-emitting subpixels, and one blue light-emitting subpixel in each pixel. However, if patterning complexity is a more important factor to be considered, to simplify a pixel patterning, the full-color organic display in accordance with present invention can also have one red light-emitting subpixel, one green light-emitting subpixels, and one blue light-emitting subpixel in each pixel.

In a full-color organic display in accordance with the present invention, the surface emitting area of a light-emitting subpixel of a particular color is a function of the efficiency of the light-emitting subpixel, the lifetime of the light-emitting subpixel, the number of light-emitting subpixels of the color in each pixel, the relative contribution of the color of the light-emitting subpixel to a desired white balance of the display, and the patterning complexity. It is preferable that the surface emitting area of each EL subpixel in each pixel is different. Generally, the blue EL subpixel can still have the biggest surface emitting area and the green EL subpixel can have the smallest surface emitting area in the three colored EL subpixels in each pixel. However, in considering a simple patterning, each colored EL subpixel may have the same surface emitting area.

In a full-color organic display in accordance with the present invention, the shape of surface emitting area of each EL subpixel in each pixel is determined according to the relative human visual frequency response to the color, the surface emitting area of the light-emitting subpixels, and the patterning complexity. The shape of surface emitting area can be of a square, a rectangle, a triangle, a circle, or any combination thereof. Each colored EL subpixel can have differently shaped surface emitting area, or have the same shaped surface emitting area.

Other Features

Deposition of Organic Layers

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often includes a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially-defined thermal dye transfer from a donor sheet (U.S. Pat. Nos. 5,688, 551; 5,851,709; and 6,066,357) and inkjet method (U.S. Pat. No. 6,066,357).

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

The EL subpixels of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The disclosures of the patents and other publications referred to in this specification are incorporated herein by reference.

EXAMPLES

The present invention and its advantages can be better appreciated by the following inventive and comparative examples. For purposes of brevity, the materials and layers formed therefrom will be abbreviated as given below.

ITO: indium-tin-oxide; used in forming the transparent anode on glass substrates.

CFx: polymerized fluorocarbon layer; used in forming a hole-injecting layer on top of ITO.

m-TDATA: 4,4',4"-tris(N-3-methylphenyl-N-phenyl-amino)-triphenylamine; used as a host material in forming the first hole-transporting layer to improve the hole-transporting properties.

F4-TCNQ: 2,3,5,6-tetrafluoro-7,7,8,8-tetracyanoquinodimethane; used as a p-type dopant material in the first hole-transporting layer.

NPB: N,N'-bis(1-naphthyl)-N,N'-diphenyl-1,1'-biphenyl-4,4'-diamine; used in forming the second hole-transporting layer.

TBADN: 2-(1,1-dimethyethyl)-9,10-bis(2-naphthalenyl)anthracene; used as a host material in forming the light-emitting layer;

TBP: 2,5,8,11-tetra-t-butylperylene; used as a dopant material in the light-emitting layer.

Bphen: 4,7-diphenyl-1,10-phenanthroline; used in forming the first electron-transporting layer, and used as a host material in forming the second electron-transporting layer;

Li: lithium; used as a dopant material in the second electron-transporting layer to improve the electron-transporting properties.

MgAg: magnesium:silver at a ratio of 10:1.0 by volume; used in forming the cathode.

In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at room temperature. The color will be reported using Commission Internationale de l'Eclairage (CIE) coordinates.

Example 1

Comparative

The preparation of a conventional blue EL subpixel is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 $\Omega$/square. The ITO surface was subsequently treated with oxidative plasma to condition the surface as an anode. A layer of CFx, 1 nm thick, was deposited on the clean ITO surface as the HIL by decomposing $CHF_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately $10^{-6}$ Torr:

1. EL Unit:
(1) a first HTL, about 70 nm thick, consisting of m-TDATA doped with 3.0 vol. % F4-TCNQ;
(2) a second HTL, 10 nm thick, consisting of NPB;
(3) a LEL, 20 nm thick, consisting of TBADN doped with 1.5 vol. % TBP;
(4) a first ETL, 10 nm thick, consisting of Bphen; and
(5) a second ETL, 25 nm thick, consisting of Bphen doped with 1.2 vol. % Li.

2. Cathode: Approximately 220 nm Thick, Consisting of MgAg.

After the deposition of these layers, the device was transferred from the deposition chamber into a dry box (VAC Vacuum Atmosphere Company) for encapsulation. The EL performance of the device was measured at 20 mA/cm$^2$ and at room temperature. Shown in Table I is the EL performance data of the device, i.e., the drive voltage, luminance, luminous yield, efficiency (in units of W/A), CIEx, CIEy, and luminance peak.

Example 2

A blue EL subpixel was constructed in the manner described in Example 1, and the deposited layer structure is:

1. 1$^{st}$ EL Unit:
(1) a first HTL, about 70 nm thick, consisting of m-TDATA doped with 3.0 vol. % F4-TCNQ;
(2) a second HTL, 10 nm thick, consisting of NPB;
(3) a LEL, 20 nm thick, consisting of TBADN doped with 1.5 vol. % TBP;
(4) a first ETL, 10 nm thick, consisting of Bphen; and
(5) a second ETL, 25 nm thick, consisting of Bphen doped with 1.2 vol. % Li.

2. 2$^{nd}$ EL Unit:
(1) a first HTL, about 55 nm thick, consisting of m-TDATA doped with 3.0 vol. % F4-TCNQ;
(2) a second HTL, 10 nm thick, consisting of NPB;
(3) a LEL, 20 nm thick, consisting of TBADN doped with 1.5 vol. % TBP;
(4) a first ETL, 10 nm thick, consisting of Bphen; and
(5) a second ETL, 25 nm thick, consisting of Bphen doped with 1.2 vol. % Li.

3. Cathode: Approximately 330 nm Thick, Consisting of MgAg.

The EL performance of the device was measured at 20 mA/cm$^2$ and at room temperature. The EL performance data is shown in Table I.

TABLE I

| Example (Type) (EL measured at 20 mA/cm$^2$) | Voltage (V) | Luminance (cd/m$^2$) | Luminous Yield (cd/A) | Efficiency (W/A) | CIE x | CIE y | EL Peak (nm) |
|---|---|---|---|---|---|---|---|
| 1 (Comparative) | 5.3 | 738 | 3.69 | 0.068 | 0.135 | 0.190 | 464 |
| 2 (Inventive) | 9.7 | 1485 | 7.42 | 0.143 | 0.130 | 0.183 | 464 |

The blue EL subpixel fabricated in accordance with the present invention has doubled the luminance at the same testing current density with improved color purity. At the same time, it has still kept the drive voltage under 10 volts. Since half of the current density is needed to keep a predetermined brightness as in example 1, the lifetime of the blue EL subpixel in example 2 can be increased by a factor of 2. As a result, the overall lifetime of a full-color organic display in accordance with the present invention can be increased.

The invention has been described in detail with particular reference to certain preferred embodiments thereof, but it will be understood that variations and modifications can be effected within the spirit and scope of the invention.

PARTS LIST 100 pixel in a full-color organic display (prior art)
101 substrate
102 organic insulating layer
103 organic insulating layer
104 conductive wiring
EL11 red EL subpixel
111 circuitry unit in red EL subpixel
112 anode pad in red EL subpixel
113 red EL unit
EL12 green EL subpixel
121 circuitry unit in green EL subpixel
122 anode pad in green EL subpixel
123 green EL unit
EL13 blue EL subpixel
131 circuitry unit in blue EL subpixel
132 anode pad in blue EL subpixel
133 blue EL unit
200(EL13) blue EL subpixel in pixel 100 (prior art)
133.1 1$^{st}$ hole-transporting layer
133.2 2$^{nd}$ hole-transporting layer
133.3 blue light-emitting layer
133.4 1$^{st}$ electron-transporting layer
133.5 2$^{nd}$ electron-transporting layer
180 cathode
300 pixel in a full-color organic display (present invention)
EL33 blue EL subpixel
335 blue EL unit
400(EL33) blue EL subpixel in pixel 300
500 pixel in another full-color organic display (present invention)
EL53 blue EL subpixel
534 intermediate connector
600(EL53) blue EL subpixel in pixel 500

The invention claimed is:

1. An OLED device comprising:
   a) an anode and a cathode spaced from the anode;
   b) two EL units disposed between the anode and cathode, such EL units being in contact with each other and each having at least one light emitting layer; and
   c) each EL unit further includes a p-type doped organic hole transporting layer disposed between The light emitting layer of that EL unit and the anode, and an n-type doped organic electron transporting layer disposed between the light emitting layer of that EL unit and the cathode;
   wherein the n-type doped organic electron transporting layer of The EL unit that is closest to the anode is in direct contact with the p-type doped organic hole transporting layer of the other EL unit.

2. The OLED device of claim 1 wherein at least one p-type doped organic hole transporting layer includes an aromatic tertiary amine.

3. The OLED device of claim 1 wherein at least one n-type doped organic electron transporting layer includes a phenanthroline derivative.

4. The OLED device of claim 2 wherein at least one n-type doped organic electron transporting layer includes a phenanthroline derivative.

5. The OLED device of claim 1 wherein at least one light emitting layer includes an anthracene derivative.

6. The OLED device of claim 4 wherein at least one light emitting layer includes an anthracene derivative.

7. The OLED device of claim 1 wherein each p-type doped organic hole transporting layer is formed of the same material.

8. The OLED device of claim 7 wherein each n-type doped organic electron transporting layer is formed of the same material.

* * * * *